United States Patent
Chen et al.

(10) Patent No.: US 6,848,882 B2
(45) Date of Patent: Feb. 1, 2005

(54) APPARATUS AND METHOD FOR POSITIONING A CASSETTE POD ONTO A LOADPORT BY AN OVERHEAD HOIST TRANSPORT SYSTEM

(75) Inventors: Ho-Jen Chen, Tucheng (TW); Fan-Lin Lu, Taipei (TW); Ko-Chin Chung, Taipei (TW); Yu-Tan Tseng, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 120 days.

(21) Appl. No.: 10/404,991

(22) Filed: Mar. 31, 2003

(65) Prior Publication Data

US 2004/0191042 A1 Sep. 30, 2004

(51) Int. Cl.$^7$ ............................................. B65G 49/07
(52) U.S. Cl. .................... 414/626; 414/217.1; 414/805; 414/940
(58) Field of Search .............................. 414/217, 217.1, 414/626, 805, 814, 940

(56) References Cited

U.S. PATENT DOCUMENTS

| | | | | |
|---|---|---|---|---|
| 3,272,348 A | * | 9/1966 | Metz | 414/626 |
| 6,082,949 A | * | 7/2000 | Rosenquist | 414/217 |
| 6,183,184 B1 | * | 2/2001 | Shiwaku | 414/281 |
| 6,473,996 B1 | * | 11/2002 | Tokunaga | 34/417 |
| 6,641,348 B1 | * | 11/2003 | Schultz et al. | 414/217 |
| 6,715,978 B2 | * | 4/2004 | Lin et al. | 414/16.05 |
| 2003/0198540 A1 | * | 10/2003 | Lin et al. | 414/217 |
| 2003/0198553 A1 | * | 10/2003 | Lin et al. | 414/805 |

* cited by examiner

Primary Examiner—James W. Keenan
(74) Attorney, Agent, or Firm—Tung & Associates (57) ABSTRACT

An apparatus and a method for positioning a cassette pod onto a loadport by an overhead hoist transport system are described. The apparatus includes a vertical front panel of a process machine equipped with a docking opening therein, a loadport stage extending horizontally from the vertical front panel, a loadport situated on the loadport stage, at least two back guiding plates situated on the back of the loadport, at least two side guiding plates with one situated on each side of the loadport, a front guiding plate situated on the front side of the loadport, and a clamp positioner for guiding the position of an OHT clamp during an unloading operation of the cassette pod. The two halves of the clamp positioner move sideways away from each other to allow the cassette pod to pass therethrough during a loading operation.

16 Claims, 5 Drawing Sheets

APPARATUS AND METHOD FOR POSITIONING A CASSETTE POD ONTO A LOADPORT BY AN OVERHEAD HOIST TRANSPORT SYSTEM

FIELD OF THE INVENTION

The present invention generally relates to an apparatus and method for loading/unloading a cassette pod onto/from a loadport and more particularly, relates to an apparatus and a method for guiding the loading/unloading of a cassette pod onto/from a loadport by a clamp of an overhead hoist transport (OHT) system utilizing a plurality of guiding plates.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes.

Figure 1:
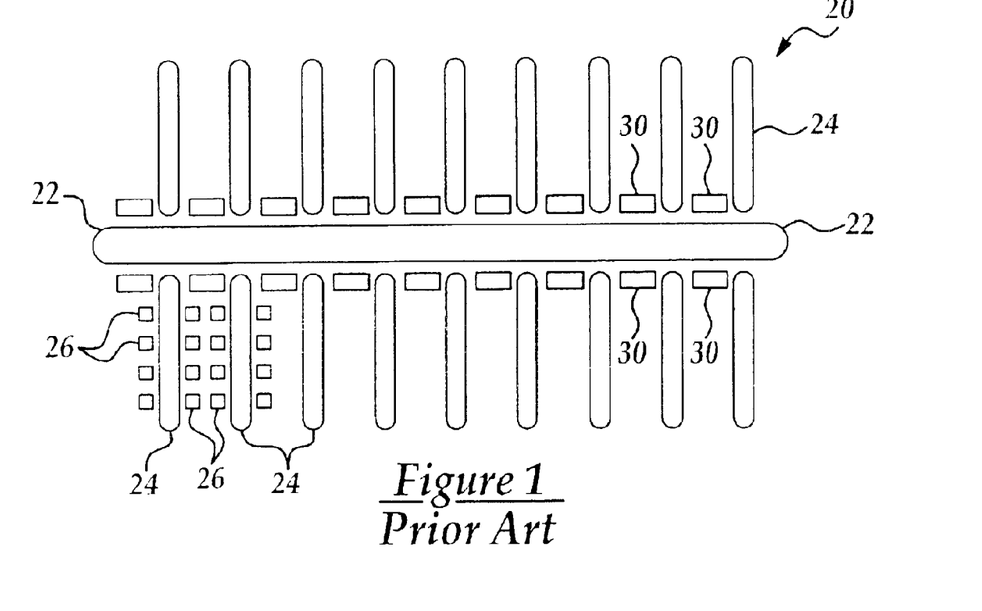
FIG. 1 is an illustration of a conventional OHT system for serving a plurality of stockers and process machines.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/out to bay 24, or to precessing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation.

Figure 2:
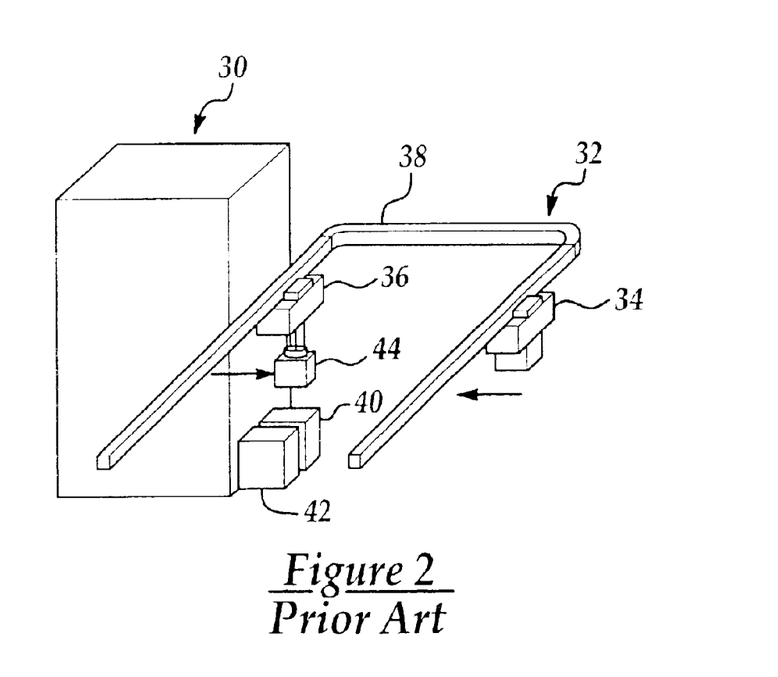
FIG. 2 is an illustration of a conventional OHT system for loading cassette pods into a process machine.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGE and OHT utilize the input/output ports of a stocker to load or unload wafer lots, i.e. normally stored in POUFs. FIG. 2 is a perspective view of an overhead hoist transport system 32 consisting of two vehicles 34,36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Figure 3:
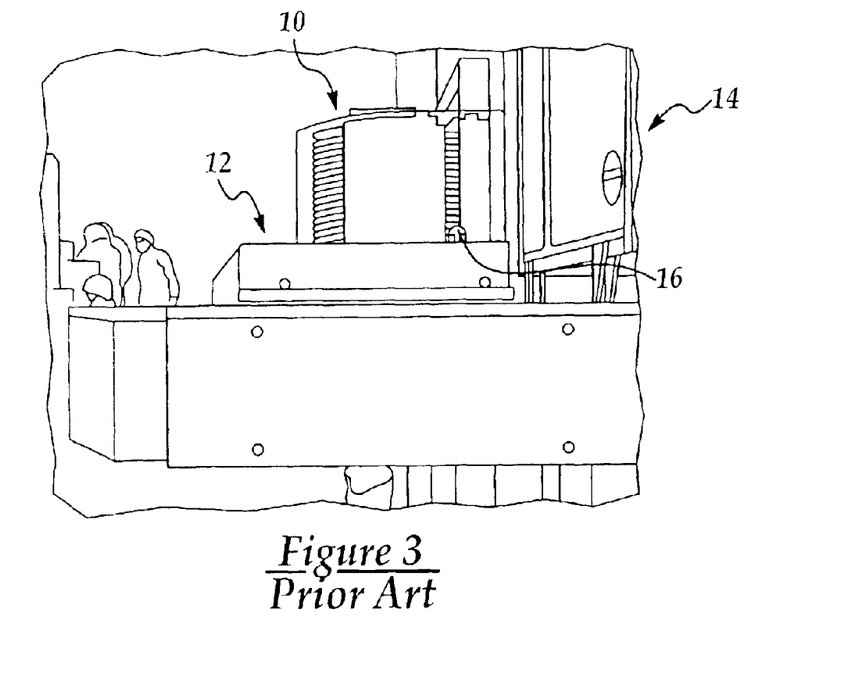
FIG. 3 is a perspective view of a cassette pod situated on a conventional loadport of a process machine.
Figure 4:
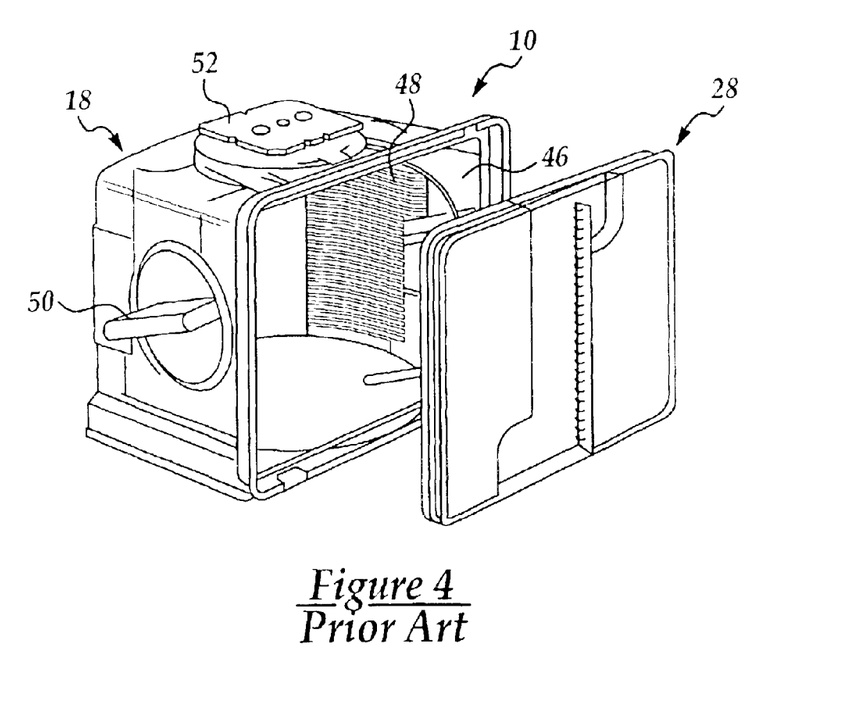
FIG. 4 is a perspective view of a conventional cassette pod with a removable back panel.

Similarly, the OHT system is also used to deliver a cassette pod such as a FOUP to a process machine. This is shown in FIG. 3. A cassette pod 10 of the FOUP type is positioned on a loadport 12 of a process machine 14. The loadport 12 is frequently equipped with a plurality of locating pins 16 for the proper positioning of the cassette pod 10. A detailed perspective view of the FOUP 10 is shown in FIG. 4. The FOUP 10 is constructed of a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of an OHT system (not shown).

When an OHT system is utilized in transporting a cassette pod to a process machine, problems arise when the loadport of the process machine is not in alignment with the OHT system. Mis-positioned cassette pods on a loadport not only affects the operation of loading/unloading wafers from the pod, but also in severely misaligned cases may cause the cassette pod to tip over resulting in the breakage of wafers. Conventionally, manual adjustment is used to align the loadport of a process machine to an OHT system. This can be an extremely time consuming process which affects the yield.

Figure 5:
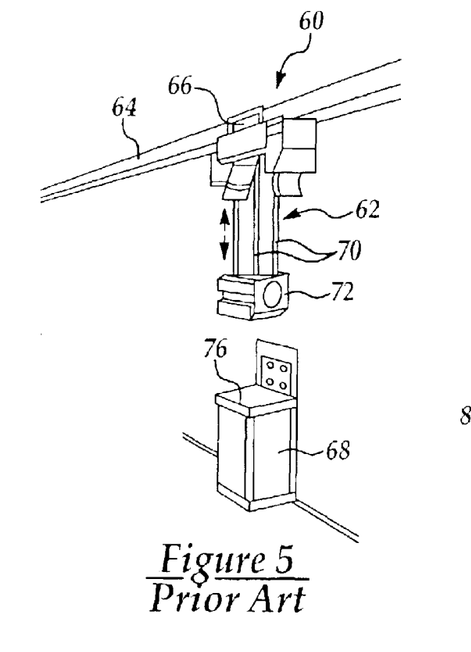
FIG. 5 is a perspective view of an OHT system delivering a cassette pod to a loadport of a process machine.

FIG. 5 is a perspective view of an OHT 60 system in relation to a process machine. The OHT system 60 consists essentially of an OHT delivery arm 62, an OHT rail 64 and an OHT controller 66. The OHT delivery arm 62 consists of a plurality of cables 70 for holding a cassette pod 72 by a clamp (not shown) The OHT delivery arm 62 delivers the cassette pod 72 to a top surface 76 of a loadport 68 attached to a process machine (not shown).

It is therefore an object of the present invention to provide an apparatus for aligning of a wafer cassette pod to/from a loadport OHT system that does not have the drawbacks or the shortcomings of the conventional apparatus.

It is another object of the present invention to provide an apparatus for aligning the loading/unloading of a cassette pod to/from a loadport by an OHT system utilizing a plurality of guiding plates mounted on the loadport stage.

It is a further object of the present invention to provide an apparatus for positioning a cassette pod onto a loadport of a process machine by utilizing at least two back guiding plates, at least two side guiding plates, and a front guiding plate mounted on the loadport stage.

It is another further object of the present invention to provide an apparatus for positioning a cassette pod onto a loadport of a process machine by utilizing a plurality of guiding plates mounted on the loadport stage and a clamp positioner for positioning an OHT clamp, wherein the positioner is suspended over the loadport stage.

It is still another further object of the present invention to provide a method for loading a cassette pod onto a loadport of a process machine with high accuracy.

It is yet another object of the present invention to provide a method for removing a cassette pod from a loadport of a process machine by guiding an OHT clamp onto a cassette pod using a clamp positioner provided in two halves.

SUMMARY OF THE INVENTION

In accordance with the present invention, an apparatus and a method for positioning a cassette pod onto a loadport by an overhead transport system are provided.

In a preferred embodiment, an apparatus for positioning a cassette pod onto a loadport of a process machine is provided which includes a process machine that has a vertical front panel and a docking opening therein; a loadport stage extending horizontally outwardly from the vertical front panel; a loadport situated on the loadport stage for receiving a cassette pod on a top surface; at least two back guiding plates situated spaced-apart from each other in-between the loadport and the vertical front panel extending upwardly from the loadport stage and tilted at least 5° from a vertical plane for guiding a backside of a cassette pod onto the loadport, the at least two back guiding plates capable of moving sideways in opposite directions away from the docking opening; at least two side guiding plates with one situated fixedly on each of the two sides of the loadport extending upwardly from the loadport stage tilted at least 5° from a vertical plane for guiding two sides of a cassette pod onto the loadport; a front guiding plate situated fixedly on the front side of the loadport extending upwardly from the loadport stage and tilting at least 5° from a vertical plane for guiding a front side of a cassette pod onto the loadport; and a clamp positioner provided in two halves extending outwardly from the vertical front panel and are suspended over the at least two back guiding plates for guiding a clamp of an overhead transport system to a top bracket on the cassette pod during an unloading operation of the pod from the loadport, the two halves of the clamp positioner capable of being moved sideways away from each other to allow an unobstructed passageway to the loadport during a loading operation of a cassette pod.

The apparatus for positioning a cassette pod onto a loadport of a process machine may further include motor means for moving the at least two back guiding plates sideways in opposite directions away from the docking opening, or motor means for moving the two halves of the clamp positioner sideways away from each other to allow an unobstructed passageway to the loadport. The at least two back guiding plates may include two back guiding plates spaced-apart at least 3 cm from each other. Each one of the two halves of the clamp positioner may be constructed of three sloped side panels forming a top opening larger than a bottom opening for guiding a clamp of an overhead transport system. The loadport may further include at least three positioning pins situated in a top surface for locating the cassette pod. The front guiding plate may further include an opening allowing visual observation of a tag situated on the front side of the cassette pod.

The present invention is further directed to a method for removing a cassette pod from a loadport of a process machine which can be carried out by the steps of providing a process machine that has a vertical front panel and a docking opening therein; providing a loadport stage extending horizontally outwardly from the vertical front panel; providing a loadport situated on the loadport stage for receiving a cassette pod on a top surface; mounting a clamp positioner in two halves extending outwardly from the vertical front panel and suspending over the at least two back guiding plates used for guiding a backside of a cassette pod onto the loadport; guiding a clamp of an overhead transport system by the clamp positioner to clamp onto a bracket on top of the cassette pod; moving the two halves of the clamp positioner away from each other to clear a passageway for the cassette pod to be moved upwardly; and removing the cassette pod from the loadport in an upward direction by the clamp of the overhead transport system.

The method for removing a cassette pod from a loadport of a process machine may further include the step of moving the two halves of the clamp positioner toward each other to clamp onto the bracket on top of the cassette pod by motor means. The method may further include the step of constructing the two halves of the clamp positioner with three sloped side panels forming a top opening larger than a bottom opening, or the step of lowering the clamp of the overhead transport system onto the bracket of the cassette pod, or the step of removing the cassette pod from the loadport by raising the clamp by motor means.

The present invention is still further directed to a method for loading a cassette pod onto a loadport of a process machine which can be carried out by the steps of providing a process machine that has a vertical front panel and a docking opening therein; providing a loadport stage extending horizontally outwardly from the vertical front panel; providing a loadport situated on the loadport stage for receiving a cassette pod on a top surface; mounting at least two back guiding plates spaced-apart from each other in-between the loadport and the vertical front panel extending upwardly from the loadport stage at an angle of at least 5° as measured from a vertical plane for guiding a backside of a cassette pod onto the loadport, the at least two back guiding plates move sideways in opposite directions away from the docking opening during a docking process for the cassette pod; mounting at least two side guiding plates with one situated fixedly on each of the two sides of the loadport extending upwardly from the loadport stage at an angle of at least 5° measured from a vertical plane for guiding two sides of the cassette pod onto the loadport; mounting a front guiding plate fixedly on the front side of the loadport extending upwardly from the loadport stage at an angle of at least 5° measured from a vertical plane for guiding a front side of a cassette pod onto the loadport; providing a clamp positioner in two halves which extends outwardly from the vertical front panel and suspends over the at least two back guiding plates; moving the two halves of the clamp positioner sideways away from each other to allow an unobstructed passageway to the loadport; and guiding a cassette pod clamped by the clamp of the overhead transport system by the at least two back guiding plates, the at least two side guiding plates and the front guiding plate onto the loadport of the process machine.

The method for loading a cassette pod onto a loadport of a process machine may further include the step of moving the two halves of the clamp positioner sideways away from each other by motor means, or the step of moving the at least two back guiding plates sideways in opposite directions away from the docking opening, or the step of moving the at least two back guiding plates sideways by motor means.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for positioning a cassette pod onto a loadport by an overhead hoist transport (OHT) system.

The present invention apparatus for positioning a cassette pod onto a loadport of a process machine includes a process machine that has a vertical front panel and a docking opening therein; a loadport stage extending horizontally from the vertical front panel; a loadport situated on the loadport stage for receiving a cassette pod on a top surface; at least two back guiding plates; at least two side guiding plates; a front guiding plate; and a clamp positioner for guiding a clamp of the OHT system to a top bracket on the cassette pod during an unloading process of the cassette pod from the loadport.

The at least two back guiding plates are situated spaced-apart from each other and extend upwardly from the loadport stage at a 5° tilt away from the loadport for guiding a backside of a cassette pod onto the loadport. The at least two back guiding plates can be moved sideways in opposite directions away from the docking opening to provide a clear access to the opening. The at least two side guiding plates with one situated in a fixed manner on each of the two sides of the loadport extends upwardly from the loadport stage at a 5° tilt angle away from the loadport for guiding two sides of a cassette pod onto the loadport. The front guiding plate is fixedly situated on the front side of the loadport extending upwardly from the loadport stage and tilting at least 5° from a vertical plane away from the loadport for guiding a front side of a cassette pod onto the loadport.

The clamp positioner is provided in two halves which extend outwardly from the vertical front panel and are suspended over the at least two back guiding plates for guiding a clamp of an overhead hoist transport system to a top bracket of the cassette pod during an unloading operation of the pod from the loadport. The two halves of the clamp positioner, during the loading of a cassette pod, are moved away from each other to allow an unobstructed passageway to the loadport by a cassette pod.

Figure 6:
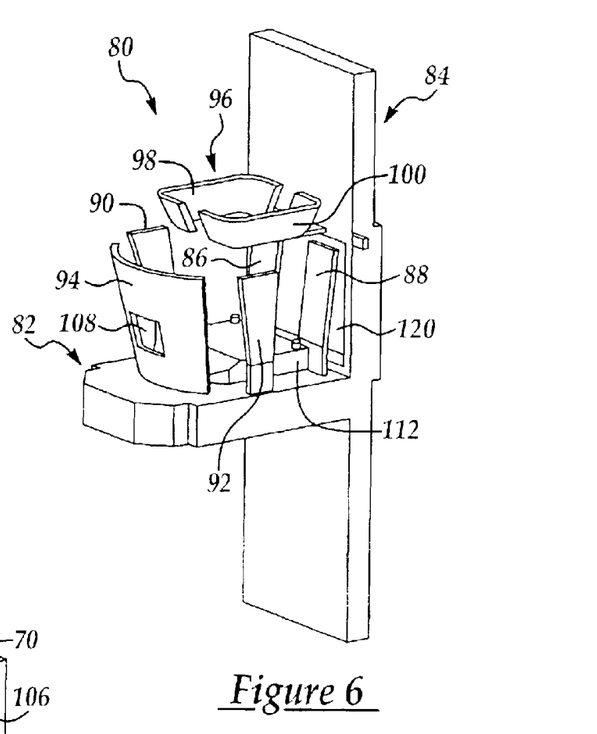
FIG. 6 is a perspective view of the present invention apparatus for loading/unloading a cassette pod to/from a loadport.

Referring now to FIG. 6, wherein a present invention apparatus for loading/unloading a cassette pod onto/from a loadport of a process machine is shown. The apparatus 80 is mounted on a loadport stage 82 which is in turn mounted horizontally on a vertical front panel 84 of a process machine (not shown). The apparatus 80 consists of two back guiding plates 86,88, two side guiding plates 90,92, a front guiding plate 94 and a clamp positioner 96. The clamp positioner 96 is constructed of two halves 98,100 each formed of three sloped panels such that a top opening is larger than a bottom opening. The sloped angle of the two halves 98,100 helps to position a clamp 102 (shown in FIG. 7) to be centered onto a bracket 104, also shown in FIG. 7, on top of a cassette pod 106. The front guiding plate 94 further include an opening 108 for allowing visual observation of an identification tag 110 mounted on the cassette pod 106.

Figure 7:
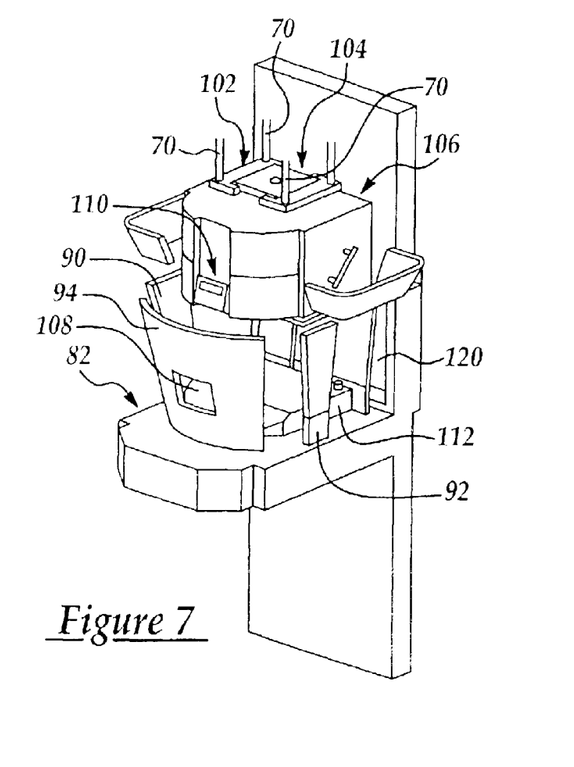
FIG. 7 is a perspective view of the present invention apparatus loading a cassette pod onto the loadport.
Figures 8, 9:
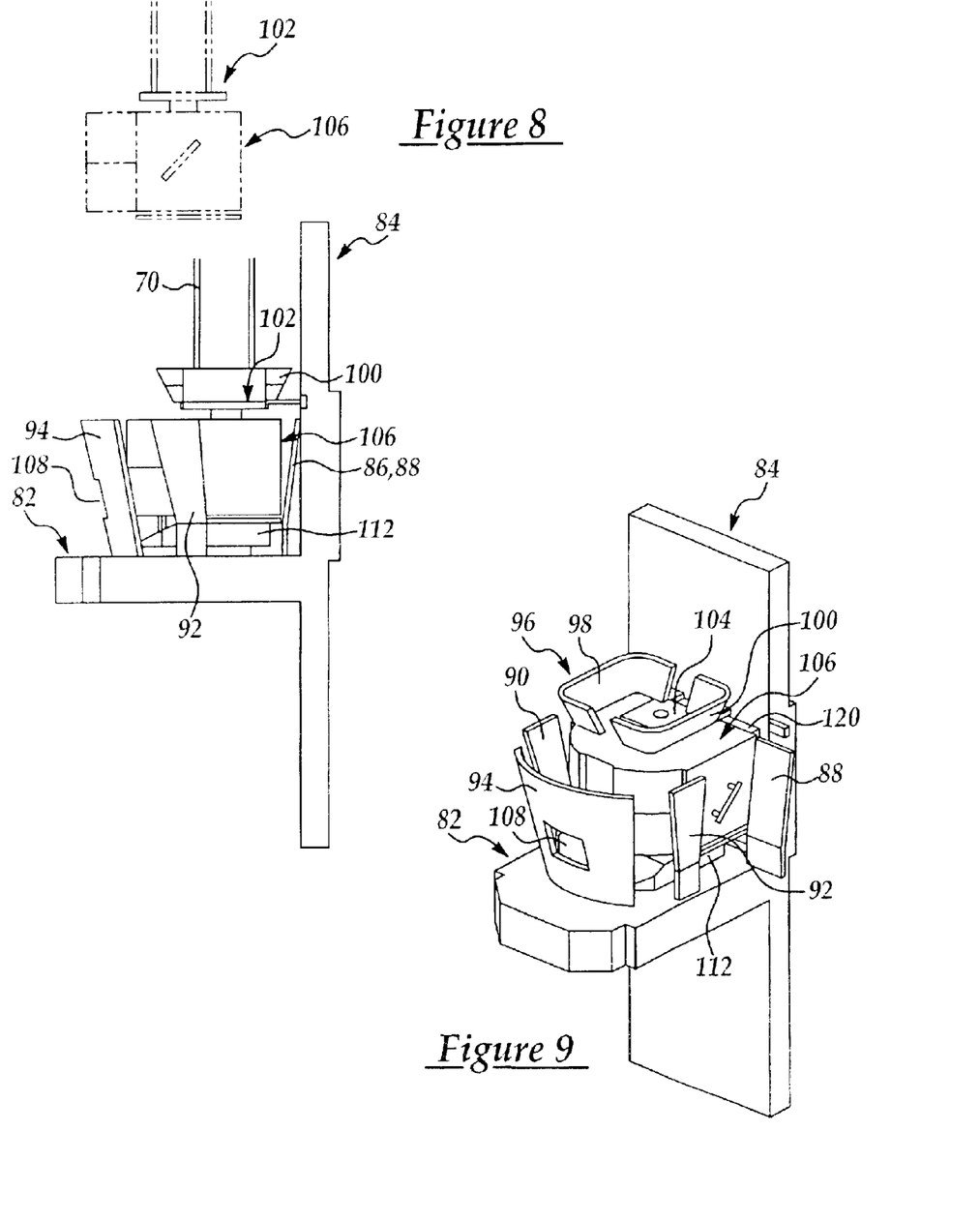
FIG. 8 is a side view of the present invention apparatus loading a cassette pod onto a loadport.
FIG. 9 is a perspective view of a cassette pod loaded onto a loadport by the present invention apparatus.

A loading operation of the cassette pod 106 onto the loadport 112 is shown in FIG. 7. The loading operation can be described as follows:

1. The OHT (not shown) drops a cassette pod 106 and suspends over the loadport stage 82 with the two halves 98,100 of the clamp positioner 96 in full open position to allow clearance to the cassette pod 106.
2. The cassette pod 106 is guided by the two back guiding plates 86,88, the two side guiding plates 90,92, and the front guiding plate 94 such that it properly seats on the loadport 112. This is shown in FIG. 8 with the top, ghost-lined figure indicating an unguided position of the cassette pod 106, while the bottom solid-lined figure indicating a guided position.
3. The clamp 102 then releases the bracket 104, and thus the cassette pod 106, and returns to the OHT rail (not shown).
4. As shown in FIG. 9, the two back guiding plates 86,88 then open, i.e. slide to the side of the docking opening 120.
5. The cassette pod 106 is thus docked to the loadport 112 and to the docking opening 120.
6. The process starts in the process machine.

The process for unloading or removing a cassette pod 106 from the loadport 112 is described as follows and shown in FIGS. 10 and 11:

1. The process is completed in the process machine.
2. The cassette pod 106 undocks from the docking opening 120.
3. The OHT clamp 102 drops down while guided, i.e. or centered, by the two halves 98,100 of the clamp positioner 96.
4. The top bracket 104 on the cassette pod 106 is clamped by the OHT clamp 102.
5. Clamp positioner 96 opens and the two halves move out of the way to clear a passageway for the cassette pod 106.

6. The cassette pod 106 is raised by the OHT clamp 102 and thus, unloaded from the loadport 112.

Figures 10, 11:
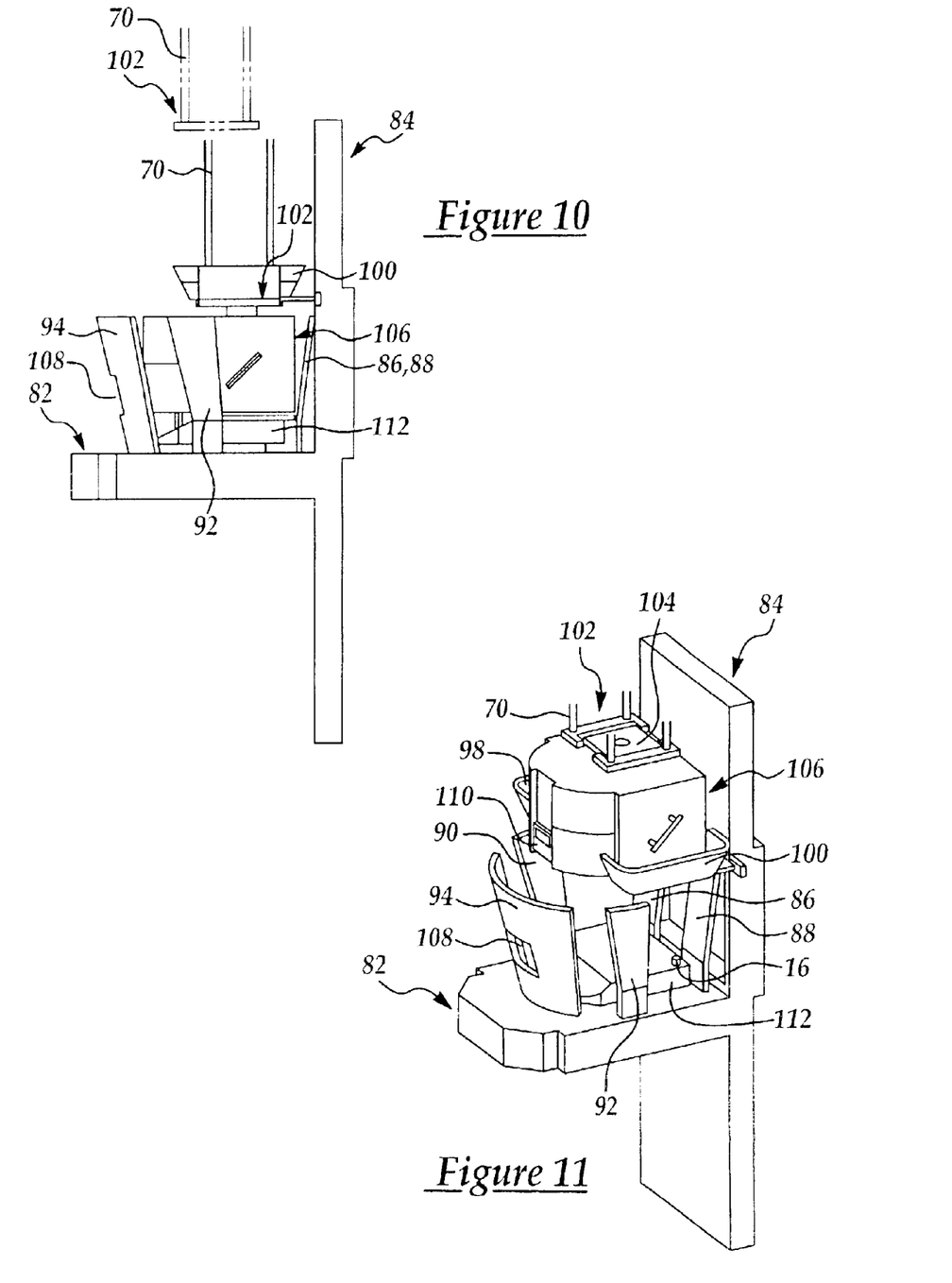
FIG. 10 is a side view of the present invention apparatus during unloading of a cassette pod from a loadport.
FIG. 11 is a perspective view of a cassette pod being unloaded from the loadport by the present invention apparatus.

The unloading process of the cassette pod 106 is also shown in FIG. 11, wherein the cassette pod 106 has moved upwardly through the passageway made by the clamp positioner 96.

The present invention novel apparatus and method for loading/unloading a cassette pod onto/from a loadport of a process machine by an OHT clamp have therefore been amply described in the above description and in the appended drawings of FIGS. 6–11.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for positioning a cassette pod onto a loadport of a process machine comprising:

a process machine having a vertical front panel and a docking opening therein;

a loadport stage extending horizontally outwardly from said vertical front panel;

a loadport situated on said loadport stage for receiving a cassette pod on a top surface of the loadport;

at least two back guiding plates situated spaced-apart from each other in-between said loadport and said vertical front panel extending upwardly from said loadport stage and tilted at least 5° from a vertical plane away from said loadport for guiding a backside of a cassette pod onto said loadport, said at least two back guiding plates capable of moving sideways in opposite directions away from said docking opening;

at least two side guiding plates with one situated fixedly on each of the two sides of said loadport extending upwardly from said loadport stage tilted at least 5° from a vertical plane away from said loadport for guiding two sides of a cassette pod onto said loadport;

a front guiding plate situated fixedly on the front side of said loadport extending upwardly from said loadport stage and tilted at least 5° from a vertical plane away from said loadport for guiding a front side of a cassette pod onto said loadport; and a clamp positioner provided in two halves extending outwardly from said vertical front panel and are suspended over said at least two back guiding plates for guiding a clamp of an overhead hoist transport system to a top bracket on said cassette pod during an unloading operation of said pod from said loadport, said two halves of the clamp positioner capable of being moved sideways away from each other to allow an unobstructed passageway to said loadport during a loading operation of a cassette pod.

2. An apparatus for positioning a cassette pod onto a loadport of a process machine according to claim 1 further comprising motor means for moving said at least two back guiding plates sideways in opposite directions away from said docking opening.

3. An apparatus for positioning a cassette pod onto a loadport of a process machine according to claim 1 further comprising motor means for moving said two halves of the clamp positioner sideways away from each other to allow an unobstructed passageway to said loadport.

4. An apparatus for positioning a cassette pod onto a loadport of a process machine according to claim 1, wherein said at least two back guiding plates comprise two back guiding plates spaced-apart at least 3 cm from each other.

5. An apparatus for positioning a cassette pod onto a loadport of a process machine according to claim 1, wherein each one of said two halves of the clamp positioner being constructed of three sloped side panels forming a top opening larger than a bottom opening for guiding a clamp of an overhead transport system.

6. An apparatus for positioning a cassette pod onto a loadport of a process machine according to claim 1, wherein said loadport further comprises at least three positioning pins situated in a top surface for locating said cassette pod.

7. An apparatus for positioning a cassette pod onto a loadport of a process machine according to claim 1, wherein said front guiding plate further comprises an opening allowing visual observation of a tag situated on the front side of said cassette pod.

8. A method for removing a cassette pod from a loadport of a process machine comprising the steps of:

providing a process machine having a vertical front panel and a docking opening therein;

providing a loadport stage extending horizontally outwardly from said vertical front panel;

providing a loadport situated on said loadport stage for receiving a cassette pod on a top surface;

mounting a clamp positioner in two halves extending outwardly from said vertical front panel and suspending over at least two back guiding plates used for guiding a backside of a cassette pod onto said loadport;

guiding a clamp of an overhead transport system by said clamp positioner to clamp onto a bracket on top of said cassette pod;

moving said two halves of the clamp positioner away from each other to clear a passageway for said cassette pod to be moved upwardly; and removing said cassette pod from said loadport in an upward direction by said clamp of the overhead transport system.

9. A method for removing a cassette pod from a loadport of a process machine according to claim 8 further comprising the step of moving said two halves of the clamp positioner toward each other to clamp onto the bracket on top of the cassette pod by motor means.

10. A method for removing a cassette pod from a loadport of a process machine according to claim 8 further comprising the step of constructing said two halves of the clamp positioner with three sloped side panels forming a top opening larger than a bottom opening.

11. A method for removing a cassette pod from a loadport of a process machine according to claim 8 further comprising the step of lowering said clamp of the overhead transport system onto said bracket of the cassette pod.

12. A method for removing a cassette pod from a loadport of a process machine according to claim 8 further comprising the step of removing said cassette pod from said loadport by raising said clamp by motor means.

13. A method for loading a cassette pod onto a loadport of a process machine comprising:

providing a process machine having a vertical front panel and a docking opening therein;

providing a loadport stage extending horizontally outwardly from said vertical front panel;

providing a loadport situated on said loadport stage for receiving a cassette pod on a top surface;

mounting at least two back guiding plates spaced-apart from each other in-between said loadport and said vertical front panel extending upwardly from said loadport stage at an angle of at least 5° from a vertical plane away from the loadport for guiding a backside of a cassette pod onto said loadport, said at least two back guiding plates move sideways in opposite directions away from said docking opening during a docking process for said cassette pod;

mounting at least two side guiding plates with one situated fixedly on each of the two sides of said loadport extending upwardly from said loadport stage at an angle of at least 5° from a vertical plane away from said loadport for guiding two sides of the cassette pod onto said loadport;

mounting a front guiding plate fixedly on the front side of said loadport extending upwardly from said loadport stage at an angle of at least 5° from a vertical plane away from the loadport for guiding a front side of a cassette pod onto said loadport;

providing a clamp positioner in two halves extending outwardly from said vertical front panel and suspended over said at least two back guiding plates;

moving said two halves of the clamp positioner sideways away from each other to allow an unobstructed passageway to said loadport; and guiding a cassette pod clamped by said clamp of the overhead transport system by said at least two back guiding plates, said at least two side guiding plates and said front guiding plate.

14. A method for loading a cassette pod onto a loadport of a process machine according to claim 13 further comprising the step of moving said two halves of the clamp positioner sideways away from each other by motor means.

15. A method for loading a cassette pod onto a loadport of a process machine according to claim 13 further comprising the step of moving said at least two back guiding plates sideways in opposite directions away from said docking opening.

16. A method for loading a cassette pod onto a loadport of a process machine according to claim 13 further comprising the step of moving said at least two back guiding plates sideways by motor means.

* * * * *